United States Patent [19]
Tsurushima

[11] 3,943,286
[45] Mar. 9, 1976

[54] VARIABLE GAIN CONTROL CIRCUIT

[75] Inventor: Katsuaki Tsurushima, Kawasaki, Japan

[73] Assignee: Sony Corporation, Tokyo, Japan

[22] Filed: Mar. 28, 1974

[21] Appl. No.: 455,786

[30] Foreign Application Priority Data
Mar. 29, 1973  Japan.............................. 48-36422

[52] U.S. Cl............. 179/1 GQ; 179/1 VL; 307/264; 330/29
[51] Int. Cl.² ...................... H04R 5/00; H03G 3/30
[58] Field of Search ........ 330/35, 145, 29; 307/264, 307/304; 328/171; 179/1 GQ, 1 G, 1 VL

[56] References Cited
UNITED STATES PATENTS

| | | | |
|---|---|---|---|
| 3,213,299 | 10/1965 | Rogers................................ | 330/35 |
| 3,229,218 | 1/1966 | Sickles et al...................... | 330/145 |
| 3,441,748 | 4/1969 | Werner.............................. | 330/35 |
| 3,798,373 | 3/1974 | Bauer............................... | 179/1 GQ |
| 3,836,791 | 9/1974 | Galloway........................... | 307/304 |

*Primary Examiner*—Douglas W. Olms
*Attorney, Agent, or Firm*—Hill, Gross, Simpson, Van Santen, Steadman, Chiara & Simpson

[57] ABSTRACT

A variable gain control circuit comprising a signal transmitting path having an input terminal supplied with an input signal and an output terminal delivering therefrom a gain controlled output signal, a variable impedance device having first, second and third electrodes, said first and second electrodes being connected between the connection point of the input and output terminals and a reference point, respectively, and said third electrode being supplied with a control voltage, a DC biasing means for applying a threshold voltage to the variable impedance device, and means for applying the same DC voltage to the first and second electrodes, whereby an undesirable signal in response to said control voltage is not produced at the output terminal of the signal transmitting path.

3 Claims, 5 Drawing Figures

VARIABLE GAIN CONTROL CIRCUIT

BACKGROUND OF THE INVENTION

1. Field of the Invention

This invention relates to a variable gain control circuit, and more particularly to an improved variable gain control circuit possible to linearly control a signal gain and effective for use in a matrix 4 channel stereo decoder.

2. Description of the Prior Art

In the prior art, a bi-polar transistor or Field Effect Transistor is used for a variable impedance device. Normally, the device is provided in parallel relationship to a signal transmitting path.

In such a case, the collector-emitter path of the bi-polar transistor or the drain-source path of the Field Effect Transistor is connected between the signal transmitting path and a reference point and the base or gate electrode is connected to a control voltage source. The bi-polar transistor or Field Effect Transistor has usually a predetermined threshold voltage, so that a control voltage supplied to the base or gate electrode cannot control the variable impedance at zero level thereof. Therefor, a DC biasing source is provided between the base and emitter electrodes or the gate and source electrodes for eliminating the defect. However, when the DC biasing source provided is such that the collector-emitter path or the drain-source path is biased in the forward direction, the control voltage applied to the base or the gate electrode is produced at the output terminal of the signal transmitting path with a predetermined amplified level so as to cause the quality of the output signal to be deteriorated.

SUMMARY OF THE INVENTION

An object of the present invention is to provide a variable gain control circuit free from the defects encountered in the prior art.

Another object of the present invention is to provide a variable gain control circuit which has linear gain control characteristics in response to a control voltage.

Yet another object of the present invention is to provide a variable gain control circuit which has a plurality of signal transmitting paths controlled by a control voltage source at a differential mode.

A further object of the present invention is to provide a variable gain control circuit which is applied to a gain control circuit in a matrix 4 channel stereo decoder.

A still further object of the invention is to provide a variable gain control circuit for use with a Silicon-Resistance Gate Type Field Effect Transistor as a variable impedance element.

The other objects, features and advantages of the present invention will be apparent from the following description taken in conjunction with the accompanying drawings.

DESCRIPTION OF THE PREFERRRED EMBODIMENTS

At first, a Silicon-resistance Gate Type MOS Field Effect Transistor (which will be hereinafter referred to simply as SRG), which is an example of the variable impedance element used in the present invention, will be described with reference to FIGS. 1 to 2.

Figure 1:
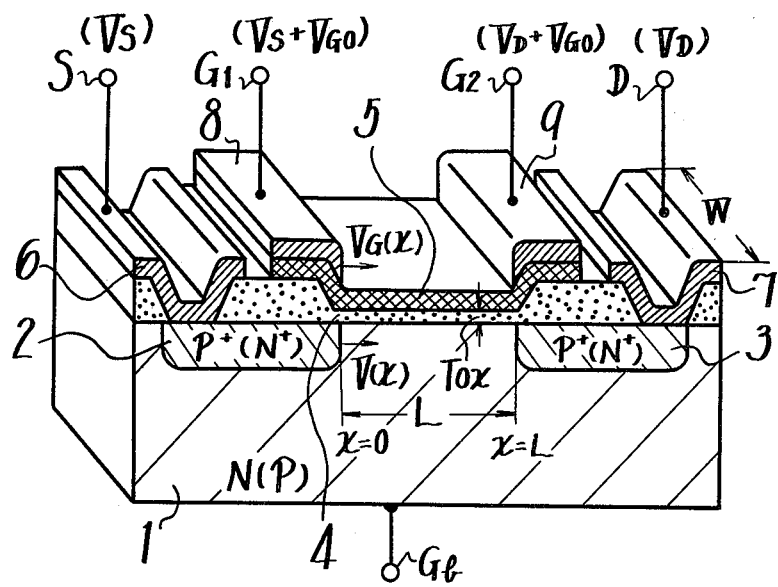
FIG. 1 is an elevational perspective view of a Silicon-Resistance Gate Type MOS Field Effect Transistor used in the invention.

FIG. 1 shows the variable impedance element SRG as a whole. The variable resistance impedance element includes a semi-conductor substrate 1 of N− or P−type conductivity. From one surface of the substrate 1, there are formed source and drain regions 2 and 3 of P+ or N+type conductivity with a predetermined distance L therebetween. An insulating layer 4 such as $SiO_2$ is formed on the surface of the substrate 1 between the source and drain regions and partially covering the both regions, and a resistive layer 5 of for example polycrystalline silicon is formed on the insulating layer 4. A source electrode 6 and a drain electrode 7 are formed on the source region 2 and the drain region 3, respectively. A first gate electrode 8 and a second gate electrode 9 are formed on the resistive layer 5 at the sides close to the electrodes 6 and 7, respectively. From the electrodes 6, 7, 8, 9 and from the substrate 1, there are led out a source terminal S, a drain terminal D, a first gate terminal $G_1$, a second gate terminal $G_2$ and a back gate terminal $G_b$, respectively.

In this case, the substrate 1 is made of relatively low impurity concentration. Especially, in the case where the element is made as a semiconductor integrated circuit and below the substrate 1 there is another substrate different in conductivity from that of the substrate 1, the substrate 1 is made with an impurity concentration having a resistance of 50 Ωcm to eliminate the influence of the latter substrate, and the regions 2 and 3 are selected to be about $10^{20}$ atoms·cm$^{-3}$ in impurity concentration. The distance or length between the regions 2 and 3 (or channel length) L is selected to be 20 microns, its width W 300 microns and the thickness $T_{ox}$ of the insulating layer 4 is about 1200 angstroms (A) in the event that it is made of $SiO_2$. The resistive layer 5 is made of polycrystalline silicon of about 1 micron in thickness. In this case, however, if the resistive layer 5 is too high in its resistance value, its ohmic contact with the gate electrodes 8 and 9 is deteriorated. While, if the resistance value of the resistive layer 5 is too low, a signal will leak. Accordingly, the resistive layer 5 is selected to be 10K Ω/□ to 1G Ω/□ in area resistance. G(x), With the SRG described as above, if the potential in the channel between the source and drain regions 2 and 3 at a point x apart from the side edge of the source region 2 opposing the drain region 3 is taken as V(x), the gate voltage of the resistive layer 5 at the point x as $V_{G(x)}$, and the threshold voltage $V_{th}$, respectively, the condition $V_G(x) - V(x) > V_{th}$ is established. Further, if it may be assumed that the modulation of the threshold voltage $V_{th}$ due to the potential of the substrate is small enough, the carrier number N of the channel in the substrate per unit area at the point x is expressed by the following equation (A).

$$N = \frac{C_o}{q}\{V_G(x) - V(x) - V_{th}\} \quad [\text{cm}^{-2}] \quad (A)$$

where $C_o = \epsilon_{ox}/T_{ox}$, $\epsilon_{ox}$ is the dielectric constant of the insulating layer 4, and $q$ the electric charge of the carrier.

If the resistance value of the channel from the side edge of the source region 2 to the point $x$ is taken as $R(x)$, the surface resistance value of channel as $\rho_S(x)$, and the moving rate of the carrier in the cannel as $\mu$, the following equation (B) is obtained.

$$dR(x) = \rho_S(x)\,(dx)/W \quad (B)$$

The surface resistance $\rho_S(x)$ can be expressed as follows:

$$\rho_S(x) = 1/(Nq\mu) \quad (C)$$

Accordingly, the equation (B) can be rewritten as follows:

$$dR(x) = \frac{1}{C_o\mu\{V_G(x) - V(x) - V_{th}\}} \cdot \frac{dx}{W} \quad (D)$$

If the channel current is taken as $I$, the following equation can be obtained.

$$dV(x) = I \cdot dR(x) = \frac{I}{W\mu C_o\{V_G(x) - V(x) - V_{th}\}} \cdot dx$$

therefore $I = \dfrac{W\mu C_o}{dx}\{V_G(x) - V(x) - V_{th}\}dV(x)$ \quad (1)

If $V_G(x) - V(x) = V_{GO}$ = constant is assumed \quad (2), (the necessary and sufficient conditions for the establishment of this assumption are $V_G(x) = V_{GO} + (x/L)V$ and hence its demonstration is omitted here), and the equation (2) is introduced into the equation (1), and the integration is carried out from $x = o$ to $x = L$, the equation (1) is expressed by the following equation (3).

$$I = \beta(V_{GO} - V_{th})V \quad (3)$$

$dV = V$ when $x = L$
$dx = L$ when $x = L$
$\beta = (W\mu C_o)/L$

If the potential of the source region 2 is taken as $V_S$ and the potential of the drain region 3 as $V_D$, the value $V$ in the equation (3) can be expressed as $V = V_D - V_S$. Further, if it is assumed that the resistive layer (5) is uniform in quality and thickness, the gate potential $V_G(x)$ is expressed as $V_G(x) = (x/L)V$ and hence it increases at the gradient of $V/L$ with respect to $x$. It is to be noted that where the letter "$x$" appears in parentheses, it means "at the point X". Where $x$ is not in parentheses, it means the distance from the source to the point $x$ in the direction of the drain. If the potential of the first gate is taken as $V_S + V_{GO}$ and that of the second gate as $V_D + V_{GO}$, the necessary and sufficient conditions for the equation (2) are established, hence the equation (3) is established, and finally the following equation (4) is obtained.

$$(1/R) = (1/V) = \beta(V_{GO} - V_{th}) \quad (4)$$

In the equation (4), the factors $\beta$ and $V_{th}$ are constants determined in accordance with the element, so that a linear resistance is established between the source and drain regions and also its resistance value can be variably controlled by the voltage $V_{GO}$. In other words, if the potentials of the source, drain, first gate and second gate are taken as $V_S$, $V_D$, $V_S + V_{GO}$ and $V_D + V_{GO}$, respectively, the linear resistance is obtained between the source and the drain and its resistance value R can be variably controlled by the voltage $V_{GO}$.

Figure 2:
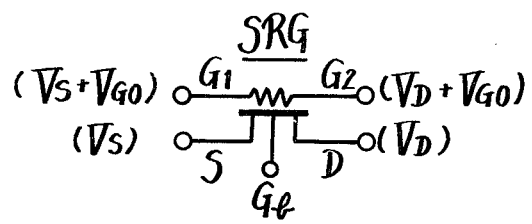
FIG. 2 shows a symbol of the FET shown in FIG. 1.

The above described SRG is symbolized as shown in FIG. 2.

The embodiment of the variable gain control circuit according to the present invention will be described with reference to FIG. 3 in which the SRG described above is employed.

Figure 3:
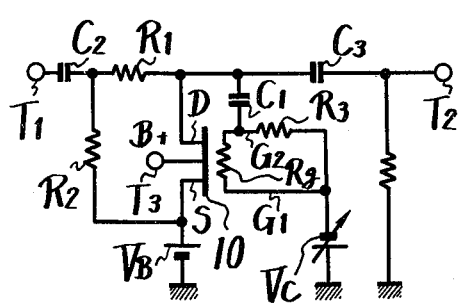
FIG. 3 shows an embodiment of the variable gain control circuit according to the invention in which the FET depicted in FIG. 1 is used.

In the embodiment of FIG. 3, $T_1$ indicates an input terminal to which a signal to be controlled is applied and $T_2$ an output terminal. A resistor $R_1$ is connected in series to a signal path between the input and output terminal $T_1$ and $T_2$ for setting the attenuation ratio. The drain electrode D of a P-channel SRG 10 is connected to the connection point between the resistor $R_1$ and the output terminal $T_2$, which connection point is grounded through a reisitor, and the source electrode S of the SRG 10 is grounded through a DC bias source $V_B$. In the case of using the P-channel SRG, the DC bias source $V_B$ is selected in polarity to make the gate electrode D negative relative to the source electrode S. A capacitor $C_1$ is inserted between the drain electrode D and the second gate electrode $G_2$ of the SRG 10. The second gate electrode $G_2$ is connected to one terminal of a control voltage source $V_C$ through a resistor $R_3$, while the first gate electrode $G_1$ of the SRG 10 is directly connected to the same terminal of the control voltage source $V_C$. In this case, $R_3$, $R_g > \frac{1}{2}fC_1$ is satisfied where $R_3$ represents the resistance value of the resistor $R_3$, $R_g$ the resistance value of the channel between the first and second gate regions of the SRG 10, $C_1$ the capacity of the capacitor $C_1$, and $f$ the frequency of the signal to be controlled. Further, in order to make sure that the drain and source electrodes are made equal from DC voltage point of view, the source electrode S is connected through a resistor $R_2$ to the input side of the resistor $R_1$. Capacitors $C_2$ and $C_3$ are provided at input and output sides, respectively, for cutting off the DC component of the signal at the input and output terminals $T_1$ and $T_2$. The back gate terminal $T_3$ (same as $G_b$) of the SRG 10 is supplied with a voltage B+ for reverse bias.

With the circuit constructed described as above, the potential of the first gate electrode of the SRG 10 becomes $V_S + V_{GO} = V_B + V_C = V_{GO(V_S = 0)}$, and the potential of the second gate electrode becomes $V_D + V_B + V_C = V_D + V_{GO}$. As a result, the impedance of the SRG 10 between the drain and source regions is superior in linearity and its value can be varied by the control voltage $V_C$ linearly. In this case, as the control voltage $V_C$ becomes high, the attenuated value of the signal applied to the input terminal $T_1$ increases.

Further, in the illustrated embodiment, between the first gate and the source of the SRG 10 there is provided the DC bias source $V_B$ for correcting the $V_{th}$ of the SRG 10, so that the control voltage $V_C$ can be controlled from zero volts linearly. The portion between the drain and the source of the SRG 10 is held at the DC voltage of the bias source $V_B$ by the loop consisting of the attenuation resistor $R_1$ and the resistor $R_2$ regardless of whether the input signal is applied to the input terminal $T_1$ or not, so that the SRG 10 does not operate within the active range against the change of the control voltage $V_C$. That is, the change of the control voltage $V_C$ is not amplified by the SRG 10 to be delivered to the output terminal $T_2$, and the distortion characteristics are much improved.

Figure 4:
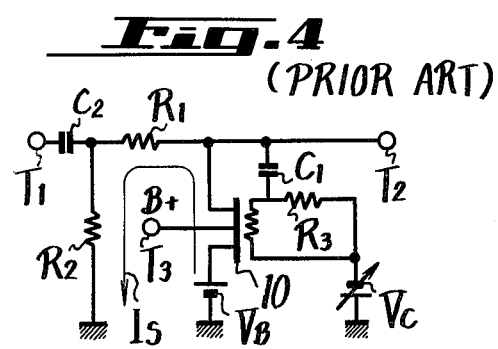
FIG. 4 shows a variable gain control circuit of the prior art.

An embodiment of the prior art in which the drain and source electrodes of the SRG 10 are not made equal in potential will be now described with reference to FIG. 4 in which reference numerals and characters are the same as those used in FIG. 3 represent the same elements. As shown in FIG. 4, in the prior art embodiment, one end of the resistor $R_2$, which end is connected to the source electrode S of the SRG 10 in FIG. 3, is grounded. The remaining circuit construction of the prior art embodiment shown in FIG. 4 is approximately same as that of the invention shown in FIG. 3 except the omission of few elements.

In the prior art embodiment of FIG. 4, if the frequency of the signal to be controlled is taken as $f$, the resistance value of the SRG 10 between its first and second gates as $R_g$, the resistance value of the resistor $R_3$ as $R_3$, and the capacity of the capacitor $C_1$ as $C_1$, they are selected to satisfy $R_3 \gg 1/2\pi f C_1$.

As a result, the potential of the drain of the SRG 10 is made $V_D$ by the signal to be controlled and that of the source becomes the ground potential ($V_S = 0$). While, since the reactance of the capacitor $C_1$ is low relative to the signal to be controlled, the potential of the second gate becomes $V_D + V_{G0}$ (where $V_C = V_B = V_{G0}$) and that of the first gate becomes $V_S + V_{G0}$ (where $V_S = 0$). As a result, the impedance of the SRG 10 between its source and drain is superior in linearity and the impedance can be varied by the control voltage $V_C$. As the control voltage $V_C$ increases, the impedance decreases.

In this embodiment, the case where the variable impedance characteristics appear in the SRG 10 is that $V_{G0} \geq V_{th}$ as apparent from the equation (4). When $V_{G0} < V_{th}$, the variable impedance characteristics cannot be obtained. Therefore, in the prior art embodiment of FIG. 4, in order to obtain a suitable attenuation even in the case of $V_C = 0$, or to initiate the attenuation from $V_C = 0$, it is necessary to apply the bias voltage $V_B$ (where $V_B \geq V_{th}$). To this end, it may be considered that the bias voltage $V_B$ is applied in superposition on the control voltage $V_C$. However in practice, since the control voltage $V_C$ is produced by a signal process with the ground potential as its reference, the superposition of the bias voltage $V_B$ on the control voltage $V_C$ requires a very complicated circuit construction and is not carried out easily. Especially, when the impedance of a signal source for the control signal is high, the above superposition becomes very difficult.

Therefore, as shown in FIG. 4, it is proposed in general that the bias voltage $V_B$ be applied to the source electrode of the SRG 10. However, in such a case a current $I_S$ flows as shown in FIG. 4 due to the bias voltage $V_B$ to cause the SRG 10 to operate as a P-channel MOS-FET within the active range. If the control voltage $V_C$ is varied in such a state, the variation is amplified by the SRG 10 and is delivered to the output terminal $T_2$. That is, the variation components of the control voltage $V_C$ are mixed into the output signal to deteriorate the quality of the output signal.

The above deterioration also occurs in the case where, in place of the SRG 10, a transistor or FET is employed as a variable impedance element. That is, it is difficult to apply the bias voltage $V_B$ easily and stably or to make the variation components of the control voltage to be not contained in output signals in that case.

On the contrary, in the embodiment of the present invention shown in FIG. 3, the resistor $R_2$ is connected in parallel to the series connection of the resistor $R_1$, the drain and source electrodes of the SRG 10, the source of the SRG 10 is supplied with the bias voltage $V_B$, and the first and second gates of the SRG 10 are supplied with the control voltage $V_C$, as described previously. Thus, the drain and source of the SRG 10 are held at the equal potential by the resistor $R_2$, so that there is no fear that the SRG 10 carries out any amplification operation and no current flows through the source-drain path of the SRG 10 caused by the bias voltage $V_B$. As a result, components of the control voltage $V_C$ are prevented from being mixed into the output signals delivered to the output terminal $T_2$.

Further, with the embodiment of the invention shown in FIG. 3, the control voltage $V_C$ and the bias voltage $V_B$ are supplied separately, so that their supply is easy and stable, and also the bias voltage $V_B$ can be freely changed to provide arbitrary attenuation characteristics.

Also, since the SRG 10 is a MOS-type one, no gate current flows and hence a signal source which is very high in impedance can be used for the control voltage $V_C$.

When a number of SRGs are formed in the same substrate as an integrated circuit for controlling the level of multi-channel signals, even if the control voltages $V_C$ are different at the respective SRGs, they can be set with the same bias voltage $V_B$ and attenuation conditions.

Figure 5:
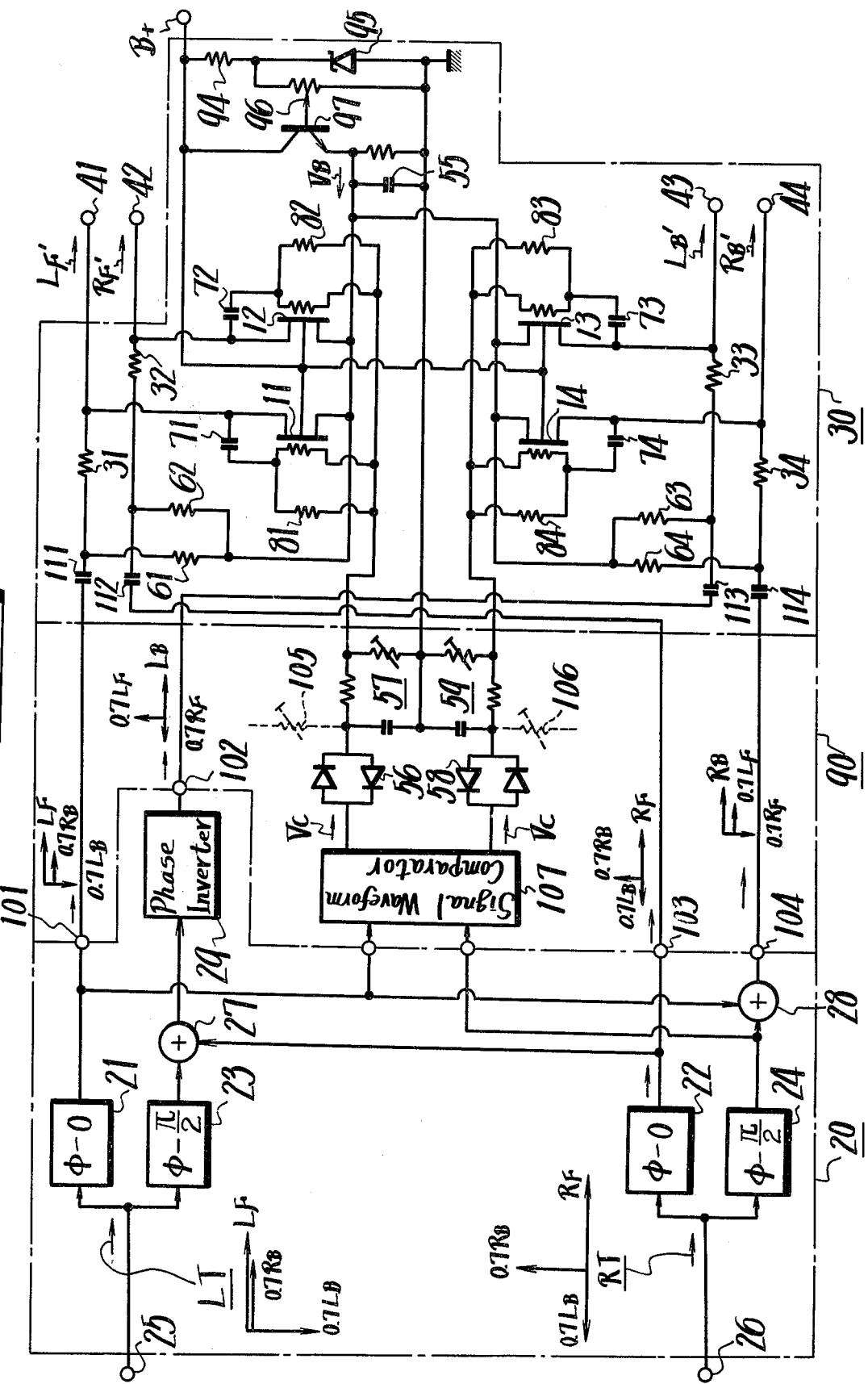
FIG. 5 is a circuit diagram showing a decoder in which variable gain control circuits according to the invention are used.

FIG. 5 shows another embodiment of the invention in which the embodiment shown in FIG. 3 is applied to a four-channel matrix stereo system. In the figure, reference numeral 20 indicates a decoder, and 25 and 26 its input terminals. If signals corresponding to the left front, right front, left back and right back of a listener are taken as $L_F$, $F_F$, $L_B$, and $R_B$, respectively, one input terminal 25 is supplied with a composite signal $L_T$ of the signals $L_F$ (pre-dominant), $L_B$ and $R_B$, while the other input terminal 26 is supplied with a composite signal $R_T$ of the signals $R_F$ (pre-dominant), $R_B$ and $L_B$. The decoder 20 consists of phase shifters 21 and 22 with the phase shift of ($\phi - 0$) and those 23 and 24 with the phase shift of ($\phi - (\pi/2)$), adding circuits 27 and 28, and a phase inverter 29. The composite signal $L_T$ fed to the input terminal 25 is then supplied to the phase shifters 21 and 23, while the other composite signal $R_T$ fed to the other input terminal 26 is supplied to the phase shifters 22 and 24, respectively. At output terminals 101 and 103 of the decoder 20, there are decoded the composite signals $L_T$ and $R_T$ applied to the terminals 25 and 26 through the phase shifters 21 and 22 with the signals $L_F$ and $R_F$ being pre-dominant, respectively. The composite signal $L_T$ applied to the input terminal 25 and passed through the phase shifter 23 is added to the composite signal $R_T$ applied to the input terminal 26 and passed through the phase shifter 22 at the adding circuit 27. The output signal from the adding circuit 27 is delivered through the phase inverter 29 to an output terminal 102 of the decoder 20 with the signal $L_B$, which is same in phase with the signals $L_F$ and $R_F$, being pre-dominant. While, the composite signal $L_T$ passed through the phase shifter 21 and the composite signal $R_T$ passed through the phase shifter 24 are added with each other at the adding circuit 28 and the output signal of the adding circuit 28, in which the signal $R_B$ same in phase with the signals $L_F$, $R_F$ and $L_B$ (delivered to the terminal 102) is pre-dominant, is delivered to an output terminal 104.

In each of the decoded output signals delivered to the output terminals 101, 102, 103 and 104, there is contained, in addition to one pre-dominant signal, a pair of crosstalk signal components. Accordingly, in order to cancel the crosstalk signals and to improve the separation, a logic circuit 90 and gain control circuit 30 are provided at the output stage of the decoder 20. The logic circuit 90 consists of a signal waveform comparator circuit 107, slicers 56, 58 and attenuator circuits 57, 59. The comparator circuit 107 compares, for example, the composite signals from the phase shifters 21 and 24 to detect which one of the signals $L_F$ and $R_B$ is pre-dominant and hence to produce at its output terminals a pair of control signals $V_C$ opposite in polarity. The slicers 56 and 58 are supplied with the control signals $V_C$ from the comparator circuit 107 to eliminate non-effective components contained in the control signals $V_C$, respectively. While, the gain control circuit 30 is formed so that the output terminals 101, 102, 103 and 104 are connected to output terminals 41, 42, 43 and 44 of the control circuit 30 through capacitors 111 to 114 and resistors 31 to 34, respectively. Loudspeakers (not shown) are connected to the output terminals 41 to 44, respectively. SRGs 11 to 14 shown in Section 30 are connected by their drain electrodes to the connection points between the resistors 31 to 34 and the output terminals 41 to 44, and at their source electrodes grounded through a common capacitor 55. The connection points between the resistors 31, 32 and the capacitors 111, 112 are connected through resistors 61 and 62 to the source electrodes of the SRGs 11 and 12, respectively, and the connection points between the resistors 33, 34 and the capacitors 113, 114 are connected through resistors 63 and 64 to the source electrodes of the SRGs 13 and 14, respectively. Capacitors 71 to 74 are connected between the drain and second gate electrodes of the SRGs 11 to 14, respectively, and resistors 81 to 84 are connected between the first and second gate electrodes of the SRGs 11 to 14, respectively. In this case, the SRGs 11 to 14 are formed in the same substrate.

One of the pair of the control signals $V_C$ opposite in polarity obtained from the logic circuit 90 is supplied to the first gate electrodes of the SRGs 11 and 12 directly, but to the second gate electrodes thereof through the resistors 81 and 82, respectively, while the other of the control signals $V_C$ is supplied to the first gate electrodes of the SRGs 13 and 14 directly, but their second gate electrodes through the resistors 83 and 84, respectively. In order to apply the DC bias voltage $V_B$ to the common capacitor 55 connected between the ground and the source electrodes of the SRGs 11 to 14, a resistor 94 and a constant voltage diode 95 are connected between a voltage source B+ and the ground. The constant voltage obtained across the constant voltage diode 95 is set by a variable resistor 96 at a predetermined value and then applied to the capacitor 55 through the base-emitter path of a transistor 97. The back gate electrodes of the SRGs 11 to 14 are supplied with a reverse bias voltage from the voltage source B+, respectively.

With the above circuit construction, the impedance of the SRGs 11 to 14 between their drain and source regions is changed linearly from $V_C=0$ in response to the control voltage $V_C$ derived from the logic circuit 90 to control the gain of the signals delivered to the output terminals 101 to 104, respectively. Therefore, the output signals obtained at the output terminals 41 to 44 are attenuated in crosstalk signal componenets and, accordingly, the pre-dominant signals are reproduced to improve the separation between channels.

With the circuit construction shown in FIG. 5, as in the case of the circuit of FIG. 3, components of the control signal $V_C$ are not contained in the signals $L_F'$, $R_F'$, $L_B'$ and $R_B'$ delivered to the output terminals 41 to 44.

In the prior art, variable resistors 105 and 106 are connected to the connection points between the slicers 56, 58 and the attenuators 57, 59, respectively, as shown in FIG. 5 by dotted lines, to apply the bias voltage $V_B$ in superposition to the control voltage $V_C$. Accordingly, if the attenuators 57 and 59 are adjusted to set the level of the bias voltage $V_B$ is also changed, which requires that the variable resistors 105 and 106 must be adjusted again. While, if the variable resistors 105 and 106 are adjusted, the DC level at the output side of the slicers 56 and 58 are changed to cause the change of the slice level. Thus, the DC level of the slicers 56 and 58 at their input side must be adjusted. For this reason, it is very troublesome to adjust the control signal $V_C$ and the bias voltage $V_B$.

However, with the circuit shown in FIG. 5, the control signal $V_C$ can be adjusted by only the attenuators 57 and 59, and the bias voltage $V_B$ can be adjusted by only the variable resistor 96. Thus, the adjustment can be achieved simply and positively.

Further, with the circuit shown in FIG. 5, since the DC voltage source B+ for correcting the threshold voltage of the SRGs 11 to 14 can be provided in common to the source electrodes of the SRGs, for example, in the case of the SRGs 11 to 14 being formed as an integrated circuit, the threshold levels of the respective SRGs 11 to 14 can be selected approximately equal to one another. As a result, the integrated circuit becomes simple in construction and superior in characteristics.

When the SRG is used as a variable impedance element, various methods for supply of the control voltage $V_C$ can be considered. By way of example, even if the resistor $R_3$ is dispensed within the example of FIG. 3, the control voltage $V_C$ is applied to the second gate electrode through the resistors between the first and second gate electrodes to similarly achieve the impedance control.

It will be apparent that many variations and modifications could be effected by those skilled in art without departing from the spirits and scope of the novel concepts of the present invention.

I claim as my invention:
1. A variable gain control circuit comprising:
   a. a signal transmitting path having signal input and signal output terminals;
   b. a first impedance means connected between said signal input and signal output terminals;
   c. a Silicon Resisted Gate type MOS field effect transistor having a conductive channel provided between its source and drain regions provided on a substrate, a silicon dioxide layer provided on said conductive channel, a resistive layer provided on said silicon dioxide layer with a constant thickness, first, second and third gate electrodes provided respectively on both ends of said resistive layer and said substrate; a second impedance means;

d. circuit means for connecting said drain electrode to said output terminal; said source electrode connected to said input terminal through said second impedance means;

e. means for supplying to said third gate electrode a reverse biasing voltage with respect to said source and drain regions;

f. circuit means for supplying AC signals from said output terminal to said first and second gate electrodes;

g. means for supplying a control voltage to said first and second gate electrodes for controlling the impedance of said conductive channel;

whereby input signals applied to said signal input terminal are linearly controlled.

2. A variable gain control circuit comprising:
a. a signal transmitting path having input and output terminals;
b. a first resistor connected between said input and output terminals;
c. a Silicon Resisted Gate type MOS field effect transistor having a conductive channel provided between its source and drain regions provided on a substrate, a silicon dioxide layer provided on said conductive channel, a resistive layer provided on the silicon layer with a constant thickness, first and second gate electrodes provided on both ends of resistive layer, and source, drain and substrate electrodes each provided to said source region, drain region and said substrate, respectively; said drain electrode connected to the connection point between the first resistor and the output terminal, a first capacitor connected between the second gate electrode and said drain electrode, a second resistor connected between said source electrode and said input terminal, a first DC biasing means connected between said source electrode and ground, and a second DC biasing source connected between said substrate electrode to reverse bias it with respect to said source and drain regions; and
d. a control voltage means connected between ground and said first gate electrode and a third resistor connected between said second gate electrode and said control voltage means whereby a signal applied to the input terminal is linearly controlled.

3. A variable gain control circuit according to claim 2 further including, a second pair of input and output terminals, a fourth resistor connected between said second input and output terminals, a second silicon Resisted Gate type MOS field effect transistor having a conductive channel provided between its source and drain regions provided on a substrate, a silicon dioxide layer of constant thickness provided on the silicon layer, first and second gate electrodes provided on said resistive layer at both ends, the first gate of said transistor connected to the first gate of said second transistor, the source of said transistor connected to the source of said second transistor, and a fourth resistor connected between said second input terminal and the source of said second transistor, the drain of said second transistor connected to said second output terminal.

* * * * *